United States Patent [19]

Ishihara et al.

[11] Patent Number: 5,303,199
[45] Date of Patent: Apr. 12, 1994

[54] REDUNDANT MEMORY DEVICE HAVING A MEMORY CELL AND ELECTRICALLY BREAKABLE CIRCUIT HAVING THE SAME DIELECTRIC FILM

[75] Inventors: Hiroshi Ishihara, Tenri; Makoto Tanigawa, Nara, both of Japan

[73] Assignee: Sharp Kabushiki Kaisha, Osaka, Japan

[21] Appl. No.: 656,441

[22] Filed: Feb. 19, 1991

[30] Foreign Application Priority Data

Feb. 19, 1990 [JP] Japan .................................. 2-39451

[51] Int. Cl.⁵ ...................... H01L 21/70; G11C 11/40
[52] U.S. Cl. .................................. 365/225.7; 365/96; 365/200; 365/149; 257/530; 257/665
[58] Field of Search ................. 365/96, 102, 149, 200, 365/225.7; 257/530, 665

[56] References Cited

U.S. PATENT DOCUMENTS

| | | | |
|---|---|---|---|
| 4,543,594 | 9/1985 | Mohsen et al. | 257/530 |
| 4,823,181 | 4/1989 | Mohsen et al. | 365/96 X |
| 4,899,205 | 2/1990 | Hamdy et al. | 257/530 |
| 4,991,137 | 5/1991 | Matsumoto | 365/149 |
| 5,130,777 | 7/1992 | Galbraith et al. | 365/96 X |

OTHER PUBLICATIONS

IEEE/IRPS '90 186-192 (Oxide-Nitride-Oxide Antifuse Reliability). Chiang et al.

Primary Examiner—Benny Lee
Attorney, Agent, or Firm—Nixon & Vanderhye

[57] ABSTRACT

An easily circuit-programmable semiconductor device which comprises a dynamic random access memory (DRAM) unit, a redundancy circuit and a connection between them, the DRAM unit having as a capacitor a dielectric film made of a silicon oxide/silicon nitride/silicon oxide composite layer and the connection having, as a member for programming the redundancy circuit, an electrically breakable dielectric film made of a silicon oxide/silicon nitride/silicon oxide composite layer.

5 Claims, 2 Drawing Sheets

REDUNDANT MEMORY DEVICE HAVING A MEMORY CELL AND ELECTRICALLY BREAKABLE CIRCUIT HAVING THE SAME DIELECTRIC FILM

BACKGROUND OF THE INVENTION

1. Field of the Invention

This invention relates to a semiconductor device and more particularly to an improvement of a connection structure between a dynamic RAM (DRAM) unit and its redundancy circuit in a semiconductor device.

2. Description of the Related Art

Various redundancy structures have been applied to many semiconductor devices, particularly to those with a large scale integration such as DRAM and the like, for improving yield and for programming the integrated circuit-system. A redundancy structure for a DRAM is so constructed that each memory unit is provided with a peripheral circuit (hereafter called a redundancy circuit) and a polysilicon fuse is interposed at a connection between the redundancy circuit and the memory unit. At least one fuse is cut off by laser-beam heating to desirably program and assemble the redundancy circuit.

The above programming of the redundancy circuit by the use of the polysilicon fuse encounters a problem is that it requires an exclusive and special apparatus for laser-beam heating.

The present invention has been accomplished under the above circumstance. An object of the invention is to provide a semiconductor device wherein a programming of a redundancy circuit can easily be operated without using the above special apparatus.

SUMMARY OF THE INVENTION

According to the present invention, there is provided a semiconductor device which comprises a dynamic random access memory (DRAM) unit and a redundancy circuit therefor. The DRAM unit has a capacitor comprising a dielectric film made of a silicon oxide/silicon nitride/silicon oxide composite layer. An electrically breakable dielectric film made of a silicon oxide/silicon nitride/silicon oxide composite layer is interposed at the connection between the DRAM unit and the redundancy circuit.

The present invention is based on the finding that the composite layer used as a capacitor in the conventional DRAM unit can easily be electrically broken down easily by the application of a high voltage. Utilization of the composite layer, in place of the conventional polysilicon fuse, for programming the redundancy circuit, makes the circuit easily programmed by voltage application without requiring any exclusive apparatus.

In the semiconductor device of the invention, the capacitor and the member for programming the redundancy circuit may be the same composite layer. Therefore, both the capacitor and the member can be formed simultaneously upon the fabrication of the semiconductor device. Thus, the member is easily formed.

DETAILED DESCRIPTION OF THE PREFERRED EMBODIMENTS

The silicon oxide/silicon nitride/silicon oxide composite layers used as the capacitor and the member for programming in the present invention can be formed over a semiconductor substrate ( e.g. Si substrate ) by Thermal Oxidation Method and CVD Method. These layers are usually formed simultaneously and have the same constitution. It is preferable that the lowermost silicon oxide layer in the composite layer be thermally grown as of 10 to 50 Å in thickness, the intermediate silicon nitride layer be deposited as of 40 to 120 Å in thickness by the low pressure CVD method.(LPCVD), and the uppermost silicon oxide layer be also thermally grown as of 10 to 50 Å. The LPCVD can be conducted by the use of $SiH_4$, $Si_2H_4$ or $SiH_2Cl_2$ and $NH_3$ as source gases under the pressure of 300 to 400 mTorr at a temperature of about 800° to 900° C. The thermal growth of the silicon oxide can be conducted by heating the surface of Si substrate or the silicon nitride layer at a temperature of about 850° to 1050° C. optionally under an atmosphere of $H_2O$ and $HCl/O_2$.

The total thickness of the composite layer is preferably 50 to 120 Å (as $SiO_2$ equivalent thickness) in respect of a balance of a dielectric breakdown strength for the capacitor and a dielectric breakdown efficiency for the member upon programming.

Applied voltage to the electrically breakable dielectric film upon programming of the redundancy circuit is usually adjusted as that of providing an electric field of 12 MV/cm or higher to the film, preferably 16 MV/cm or more.

Other than the dielectric film for programming the redundancy circuit, various structures or materials utilized in a conventional DRAM unit and redundancy circuit may be applied to the DRAM unit and redundancy circuit of the present invention.

The dielectric film, when applied with high voltage, readily breakdowns to irreversibly shortcircuit the redundancy circuit and DRAM unit. Hence, selectively applying high voltage to the desired dielectric films allows selective connection between DRAM units and the redundancy circuits to develop intended programming of the circuit. Therefore, the structure of our semiconductor device enables an improved yield in production of DRAM and a simple designing of a desired circuit-system.

EXAMPLES

Next, the invention will be detailed with referring to the examples shown in the accompanied drawings.

Figure 1:
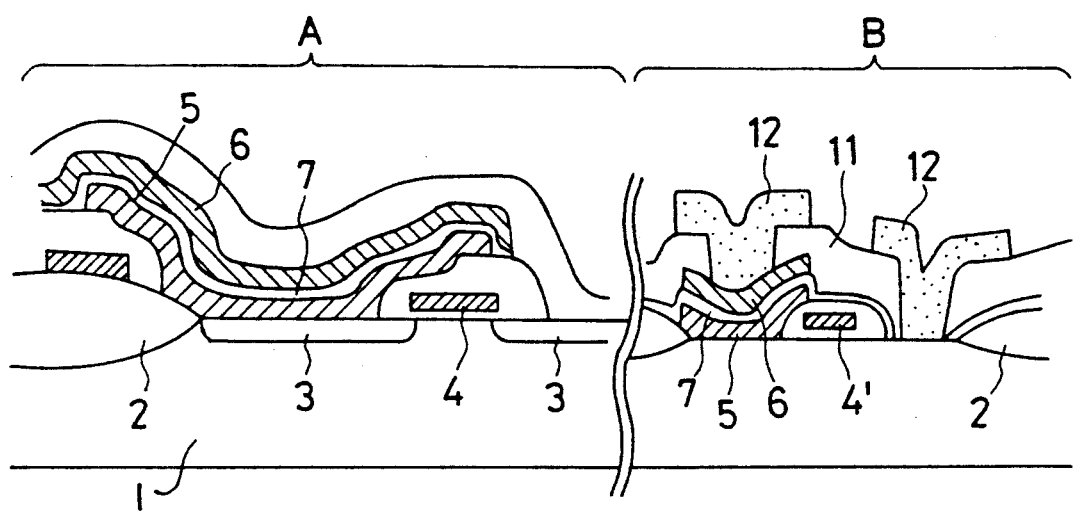
FIG. 1 is a schematic diagram showing an example of the semiconductor device of the present invention.
Figure 2:
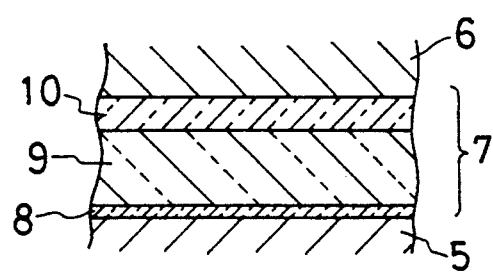
FIG. 2 is a enlarged diagram showing a portion of the semiconductor device shown in FIG. 1.

FIG. 1 is a schematic diagram showing a semiconductor device of an example of the present invention and FIG. 2 is an enlarged diagram showing an essential portion of the same.

As shown in FIG. 1, the semiconductor device of this example comprises a portion (A) constituting a DRAM unit and an another portion (B) constituting a redundancy circuit, the portions (A) and (B) being provided on a silicon semiconductor substrate 1, at least a portion of substrate 1 having a field oxide 2 (LOCUS layer) provided thereon. The DRAM portion (A) includes a polysilicon gate electrode 4, ion implanted layers 3 each forming source and drain, respectively, and a dielectric film 7 (the capacitor of the DRAM unit) interposed between the second and third polysilicon electrodes 5 and 6 over the ion implanted layer 3. The redundancy circuit portion (B) is provided with a field oxide 2 (LOCOS layer), a dielectric film 7 (the member for programming the redundancy circuit) between the second and third electrodes 5 and 6, and the first polysilicon electrode 4'. The dielectric film 7 and the second and third electrodes 5 and 6 in the portion (B) are continuously formed with and connected to the dielectric film 7 and the second and third electrodes 5 and 6 in the portion (A), respectively. The electrodes 5 and 6 constitute a connection between the DRAM unit and the redundancy circuit, the part at the portion (B) of which is used as electrodes for applying high voltage to the dielectric film 7 at the portion (B). Reference numeral 11 designates a dielectric isolation layer made of CVD-$SiO_2$ and 12 designates metal wirings made of Al. The portion (B) has substantially the same circuit constitution as a conventional transistor element used in redundancy circuit except the connection composed of the dielectric film 7 and the electrode 5 and 6.

The dielectric film 7 in this example comprises a three layer structure including a thermally-oxidized silicon oxide layer 8 of 20 Å in thickness, a LPCVD silicon nitride layer 9 of 100 Å in thickness and a thermally-oxidized silicon oxide layer 10 of 40 Å in thickness as shown in FIG. 2. The three layered film 4 is interposed between electrodes 5 and 6 as shown in FIG. 2. This composite layer (dielectric film) serves not only as a capacitor for the DRAM unit of the portion (A) but also as a dielectric film for the programming of the redundancy circuit at the portion (B).

Figure 3:
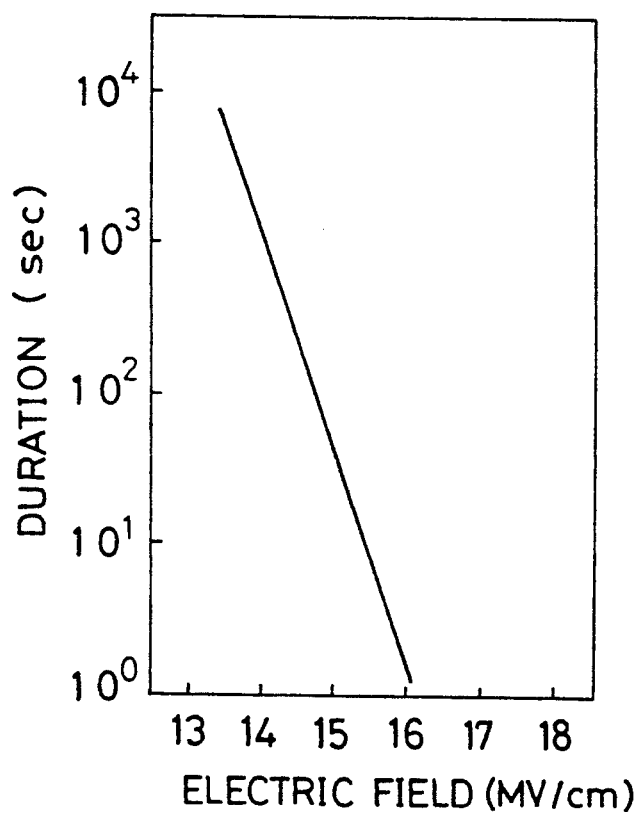
FIG. 3 is a graph showing a dependence of the duration of the dielectric film used in the present invention upon the electric field applied.

The duration of the dielectric film 7 against electric field by the voltage application between the electrodes 5 and 6 is shown in FIG. 3. As seen, the dielectric film 7 has a duration of about $10^9$ years under the voltage application of about 3 V (about 5 MV/cm) which is a conventionally applied voltage level for operating DRAM. Accordingly, the film 7 exhibits an excellent dielectric property as a capacitor of the DRAM unit. On the other hand, when an electric field over 16 MV/cm is applied, the dielectric film is broken down in a few seconds, so that the DRAM can be readily connected with the redundancy circuit. The device necessarily has a conduction therebetween after breakdown of the dielectric film. Therefore, the dielectric film at the portion (B) functions as a write once-type memory element capable of developing the conduction by simple writing operation with high voltage application, thereby enabling the DRAM to be fabricated more simply, i.e., by fewer steps. As the result, erasing defective bit lines and a programming of a redundancy circuit can be completed without using any special apparatus such as laser beam.

As described above, according to the present invention, the programming of the redundancy circuit can be simply carried out without using any special apparatus. Hence, the invention is quite useful for improving yield of DRAM and designing of circuits of custom-tip DRAM.

What is claimed is:

1. A semiconductor device which comprises a dynamic random access memory (DRAM) unit and a redundancy circuit therefor, the DRAM unit being comprised of a MOS transistor and a capacitor connected to the MOS transistor, the capacitor being comprised of a dielectric film interposed between two electrodes, the dielectric film being comprised of a silicon oxide/silicon/nitride/silicon oxide composite layer, the redundancy circuit having an electrically breakable dielectric film interposed between two electrodes, the electrically breakable dielectric film being the same film as the dielectric film of a silicon/oxide/silicon nitride/silicon oxide composite layer and interposed at a connection between the DRAM unit and the redundancy circuit, whereby the application of a predetermined voltage to the two electrodes between which the breakable dielectric film is interposed breaks the breakable dielectric film and electrically connects the DRAM unit and the redundancy circuit.

2. The semiconductor device of claim 1 in which both of the dielectric film and the electrically breakable dielectric film have a respective thickness which provides a dielectric constant equivalent to a $SiO_2$ film having a thickness of 50 to 120 Å.

3. The semiconductor device of claim 1 in which the predetermined voltage results in an electric field of at least 12 MV.

4. The semiconductor device of claim 1 in which the dielectric film of the DRAM unit and the electrically breakable dielectric film are integrally connected to each other.

5. The semiconductor device of claim 1 in which each silicon oxide of the composite layers is a thermally oxidized silicon oxide layer having a thickness of 10 to 50 Å.

* * * * *